United States Patent
Meunier et al.

(10) Patent No.: US 10,782,492 B2
(45) Date of Patent: Sep. 22, 2020

(54) HEATSINK FOR PLUGGABLE OPTICAL DEVICES FOR THE PREVENTION OF HEATSINK CLIP DEFORMATION

(71) Applicant: Ciena Corporation, Hanover, MD (US)

(72) Inventors: Trevor Meunier, Kemptville (CA); Mitchell O'Leary, Ottawa (CA); Victor Aldea, Ottawa (CA); Kamran Rahmani, Kanata (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/271,081

(22) Filed: Feb. 8, 2019

(65) Prior Publication Data

US 2020/0257067 A1    Aug. 13, 2020

(51) Int. Cl.
*G02B 6/42* (2006.01)
*H05K 7/20* (2006.01)
*H01L 23/40* (2006.01)

(52) U.S. Cl.
CPC ......... *G02B 6/4269* (2013.01); *H05K 7/2049* (2013.01); *H05K 7/20418* (2013.01); *H01L 23/4093* (2013.01); *H01L 2023/405* (2013.01); *H01L 2023/4081* (2013.01)

(58) Field of Classification Search
CPC ... H05K 7/2049; H01L 23/40; H01L 23/4093; H01L 2023/4043; H01L 2023/405; H01L 2023/4062; H01L 2023/4081; H01L 2023/4087; G02B 6/4266–4273; H01R 13/6581; H01R 24/28; H01R 24/64; H01R 25/006; H01R 2107/00
See application file for complete search history.

(56) References Cited

U.S. PATENT DOCUMENTS

| | | | | |
|---|---|---|---|---|
| 5,583,316 A | * | 12/1996 | Kitahara | F28D 15/0275 174/16.3 |
| 7,355,857 B2 | * | 4/2008 | Pirillis | H05K 9/0058 361/715 |
| 7,539,018 B2 | * | 5/2009 | Murr | H05K 7/20418 165/185 |
| 8,599,559 B1 | * | 12/2013 | Morrison | H05K 9/0058 361/702 |
| 9,620,890 B1 | * | 4/2017 | Vino, IV | G02B 6/4269 |

* cited by examiner

*Primary Examiner* — Zachary Pape
(74) *Attorney, Agent, or Firm* — Clements Bernard Walker; Lawrence A. Baratta, Jr.; Christopher L. Bernard

(57) ABSTRACT

A heatsink for pluggable optical devices that incorporates features to limit the travel and deformation of the mating/mated spring clip that holds the heatsink to the cage of a pluggable optical device. The heatsink bearing surface takes the shape and contour of the leaf spring portion of the spring clip, thereby contacting and supporting it well before it plastically yields and permanently deforms. The shape of this feature, which may be coupled to or integrally formed with the heatsink bearing surface, can match exactly the shape of the spring clip or approximate the shape using a curved, variable, or other easier to manufacture profile, as long as the associated protrusions extend up into the corners of the leaf spring portion of the spring clip. This feature effectively acts as a hard stop and prevents the spring clip from being compromised due to improper handling or installation.

17 Claims, 7 Drawing Sheets

HEATSINK FOR PLUGGABLE OPTICAL DEVICES FOR THE PREVENTION OF HEATSINK CLIP DEFORMATION

TECHNICAL FIELD

The present disclosure relates generally to the optical networking and pluggable optical device fields. More specifically, the present disclosure relates to a heatsink for pluggable optical devices for the prevention of heatsink clip deformation.

BACKGROUND ART

Pluggable optical devices, such as SFPs, QSFPs, XFPs, CFPs, etc., used on circuit packs for optical data transmission purposes plug into the faceplate of the circuit pack and have ports to accept optical fibers. These pluggable optical devices are typically inserted into a sheet metal cage or the like that is press-fit onto the PCBA of the circuit pack and has an interfacing connector at the rear of the cage. The pluggable optical devices generate a significant amount of heat and require cooling accordingly. Since these pluggable optical modules are field swappable, they must make contact and interface with a heatsink and heatsink surface that is/are devoid of any thermal interface material. Preferably, this heatsink surface applies a spring force to the top surface of the pluggable optical device during and subsequent to insertion, such that good thermal contact is made and retained between the pluggable optical device and the heatsink. This spring force is typically applied using a spring clip. Typically, this spring clip latches onto a feature on either side of the cage and applies a normal force to the top of the heatsink and the heatsink surface using a leaf spring type design.

Due to the nature of the business, power on circuit packs is continually increasing and component density on PCBAs is also increasing. This means that a larger amount of heat must be removed from all heat generating components using larger heatsinks. One way that larger heatsinks have been fit to the cages of pluggable optical devices is by extending the heatsinks well beyond the back edges of the cages. This helps improve heatsink performance, but results in a cantilevered portion of the heatsink at the back thereof. When circuit packs are assembled or installed at a customer site, due to the density of the assemblies, there are no convenient hand holds, so most assemblers or installers tend to grab the circuit pack by the heatsinks on the edge of the circuit pack right on top of the cantilevered portion of the heatsinks. This results in the heatsink pivoting and pushing on the associated spring clip, such that the leaf spring portion of the spring clip yields and deforms. This results in the spring clips not applying enough force on the bearing surface of the heatsink when the circuit pack is put into service and ultimately failing, causing product failures due to poor thermal contact between the heatsink and the pluggable optical device, resulting in overheating.

A solution to this problem of deformed and failed spring clips caused by the improper handling of cantilevered heatsinks is thus needed.

SUMMARY

The present disclosure provides a heatsink for pluggable optical devices that incorporates features to limit the travel and deformation of the mating/mated spring clip that holds the heatsink to the cage of the pluggable optical device. The heatsink bearing surface takes the shape and contour of the leaf spring portion of the spring clip, thereby contacting and supporting it well before it plastically yields and permanently deforms. The shape of this feature, which may be coupled to or integrally formed with the heatsink bearing surface, can match exactly the shape of the spring clip or approximate the shape using a curved, variable, or other easier to manufacture profile, as long as the associated protrusions extend up into the corners of the leaf spring portion of the spring clip. This feature effectively acts as a hard stop and prevents the spring clip from being compromised due to improper handling or installation, a failure that is difficult to detect until circuit packs are installed at a customer site. This feature can be added to any pluggable optical device heatsink that uses a spring clip of this nature, regardless of the heatsink fin orientation or overall heatsink shape.

In one exemplary embodiment, the present disclosure provides a heatsink assembly, including: a heatsink surface including a first surface adapted to thermally contact an adjacent pluggable optical device and a second surface adapted to receive a biasing force from a spring clip having a leaf spring including a center portion that contacts the second surface and one or more biasing portions that are spaced apart from the second surface forming one or more gaps therebetween, wherein the biasing force biases the heatsink surface into the adjacent pluggable optical device; and one or more protruding structures disposed on the second surface and adapted to fill all or a portion of the one or more gaps formed between the second surface and the one or more biasing portions of the leaf spring of the spring clip. Optionally, the one or more protruding structures are coupled to the second surface. Alternatively, the one or more protruding structures are integrally formed with the second surface. The one or more protruding structures are adapted to conform a local contour of the second surface to a contour of the center portion and the one or more biasing portions of the leaf spring of the spring clip. Optionally, the one or more protruding structures include one or more opposed ramp structures. The heatsink assembly also includes a plurality of fin structures coupled to the second surface and disposed adjacent to the one or more protruding structures. The heatsink assembly further includes a plurality of fin structures coupled to the first surface.

In another exemplary embodiment, the present disclosure provides a circuit pack assembly, including: a cage adapted to receive a pluggable optical device therein, wherein the cage defines an opening therethrough; a heatsink assembly; and a spring clip adapted to couple the heatsink assembly to the cage; wherein the heatsink assembly includes a heatsink surface including a first surface adapted to thermally contact the pluggable optical device through the opening defined through the cage and a second surface adapted to receive a biasing force from the spring clip including a leaf spring including a center portion that contacts the second surface and one or more biasing portions that are spaced apart from the second surface forming one or more gaps therebetween, wherein the biasing force biases the heatsink surface into the pluggable optical device through the opening defined through the cage; and wherein the heatsink assembly includes one or more protruding structures disposed on the second surface and adapted to fill all or a portion of the one or more gaps formed between the second surface and the one or more biasing portions of the leaf spring of the spring clip. Optionally, the one or more protruding structures are coupled to the second surface. Alternatively, the one or more protruding structures are integrally formed with the second surface. The one or more protruding structures are adapted to conform a local contour of the second surface to a contour of the center portion and the one or more biasing portions of the leaf spring of the spring clip. Optionally, the one or more protruding structures include one or more opposed ramp structures. The heatsink assembly also includes a plurality of fin structures coupled to the second surface and disposed adjacent to the one or more protruding structures. The heatsink assembly further includes a plurality of fin structures coupled to the first surface.

In a further exemplary embodiment, the present disclosure provides a method for providing a heatsink assembly, including: providing a heatsink surface including a first surface adapted to thermally contact an adjacent pluggable optical device and a second surface adapted to receive a biasing force from a spring clip having a leaf spring including a center portion that contacts the second surface and one or more biasing portions that are spaced apart from the second surface forming one or more gaps therebetween, wherein the biasing force biases the heatsink surface into the adjacent pluggable optical device; and disposing one or more protruding structures on the second surface and adapted to fill all or a portion of the one or more gaps formed between the second surface and the one or more biasing portions of the leaf spring of the spring clip. Optionally, the one or more protruding structures are coupled to the second surface. Alternatively, the one or more protruding structures are integrally formed with the second surface. The one or more protruding structures are adapted to conform a local contour of the second surface to a contour of the center portion and the one or more biasing portions of the leaf spring of the spring clip. Optionally, the one or more protruding structures include one or more opposed ramp structures. The heatsink assembly also includes a plurality of fin structures coupled to one or more of the first surface and the second surface adjacent to the one or more protruding structures.

BRIEF DESCRIPTION OF THE DRAWINGS

The present disclosure is illustrated and described with reference to the various drawings, in which like reference numbers are used to denote like assembly components/ method steps, as appropriate, and in which.

DESCRIPTION OF EMBODIMENTS

Figure 1:
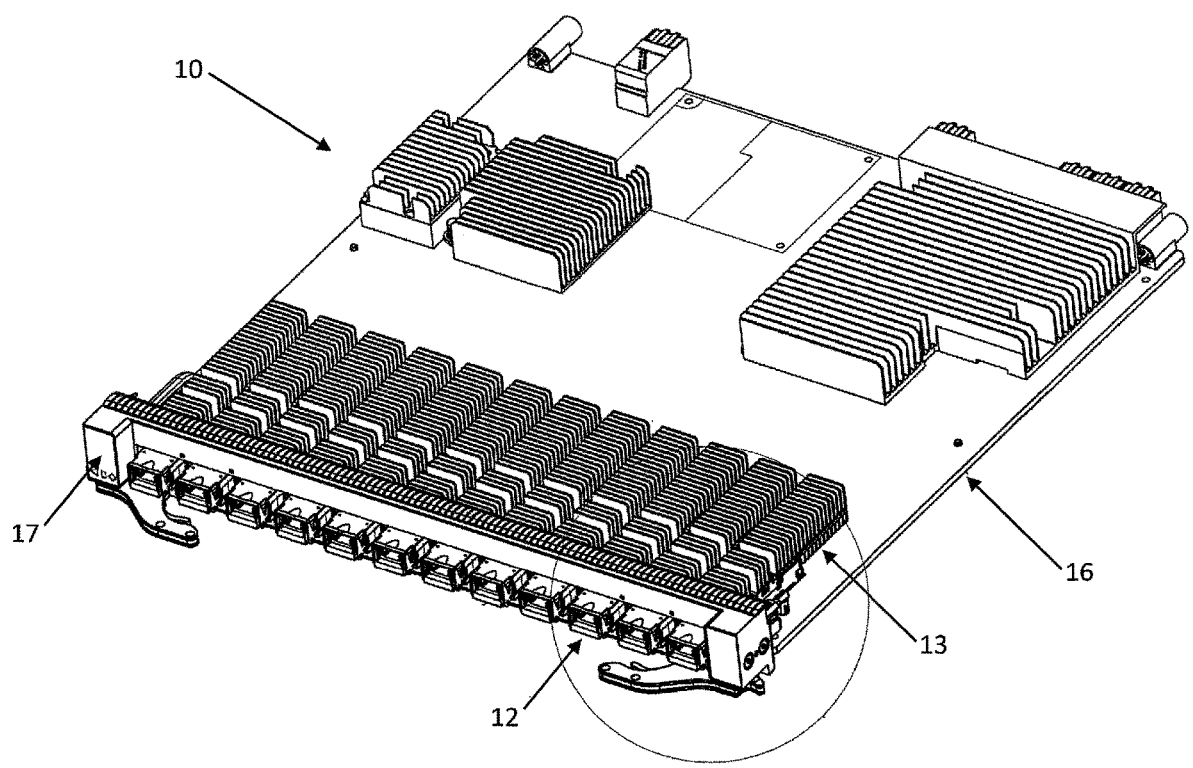
FIG. 1 is a perspective view of one exemplary embodiment of a circuit pack that utilizes the heatsink assembly provided herein.
Figure 2:
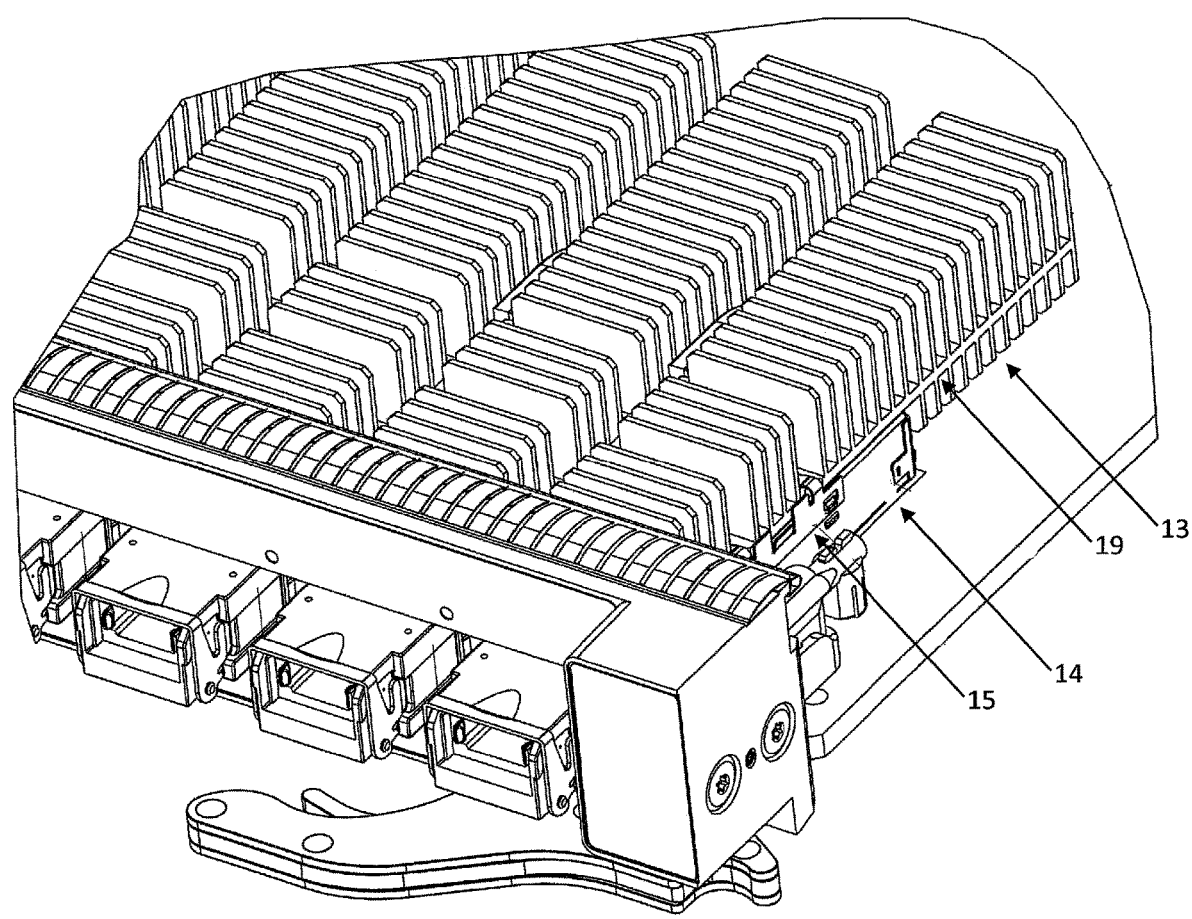
FIG. 2 is a partial perspective view of the circuit pack of FIG. 1, highlighting the associated cage, heatsink assembly, and spring clip.

Referring now specifically to FIGS. 1 and 2, pluggable optical devices 12, such as SFPs, QSFPs, XFPs, CFPs, etc., used on circuit packs 10 for optical data transmission purposes plug into the faceplate 17 of the circuit pack 10 and have ports (not illustrated) to accept optical fibers (not illustrated). These pluggable optical devices 12 are typically inserted into a sheet metal cage 14 or the like that is press-fit onto the PCBA 16 of the circuit pack 10 and has an interfacing connector (not illustrated) at the rear of the cage 14. Again, the pluggable optical devices 12 generate a significant amount of heat and require cooling accordingly. Since these pluggable optical modules 12 are field swappable, they must make contact and interface with a heatsink 13 and heatsink surface 19 that is/are devoid of any thermal interface material. Preferably, this heatsink surface 19 applies a spring force to the top surface of the pluggable optical device 12 during and subsequent to insertion, such that good thermal contact is made and retained between the pluggable optical device 12 and the heatsink 13. This spring force is typically applied using a spring clip 15. Typically, this spring clip 15 latches onto a feature on either side of the cage 14 and applies a normal force to the top of the heatsink 13 and the heatsink surface 19 using a leaf spring type design.

Power on circuit packs 10 is continually increasing and component density on PCBAs 16 is also increasing. This means that a larger amount of heat must be removed from all heat generating components using larger heatsinks 13. One way that larger heatsinks 13 have been fit to the cages 14 of pluggable optical devices 12 is by extending the heatsinks 13 well beyond the back edges of the cages 14. This helps improve heatsink performance, but results in a cantilevered portion of the heatsink 13 at the back thereof. When circuit packs 10 are assembled or installed at a customer site, due to the density of the assemblies, there are no convenient hand holds, so most assemblers or installers tend to grab the circuit pack 10 by the heatsinks 13 on the edge of the circuit pack 10 right on top of the cantilevered portion of the heatsinks 13. This results in the heatsink 13 pivoting and pushing on the associated spring clip 15, such that the leaf spring portion of the spring clip 15 yields and deforms. This results in the spring clips 15 not applying enough force on the bearing surface 19 of the heatsink 13 when the circuit pack 10 is put into service and ultimately failing, causing product failures due to poor thermal contact between the heatsink 13 and the pluggable optical device 12, resulting in overheating.

Figure 3:
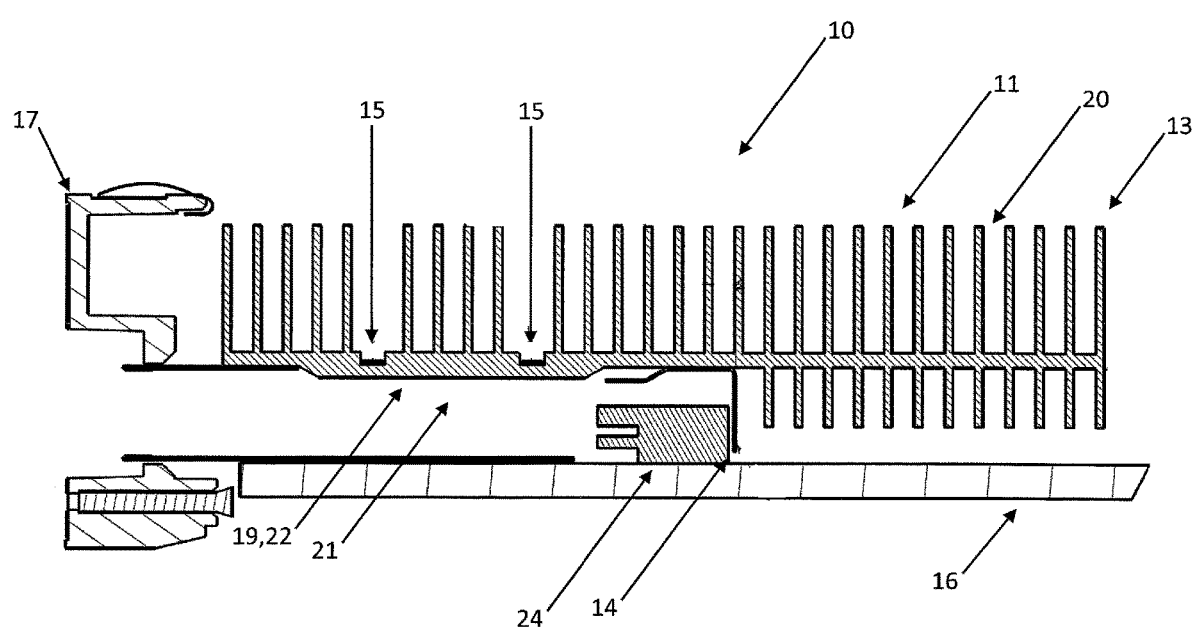
FIG. 3 is a cross-sectional side view of the circuit pack of FIG. 1, highlighting the associated cage and heatsink assembly with the pluggable optical device removed.
Figure 4:
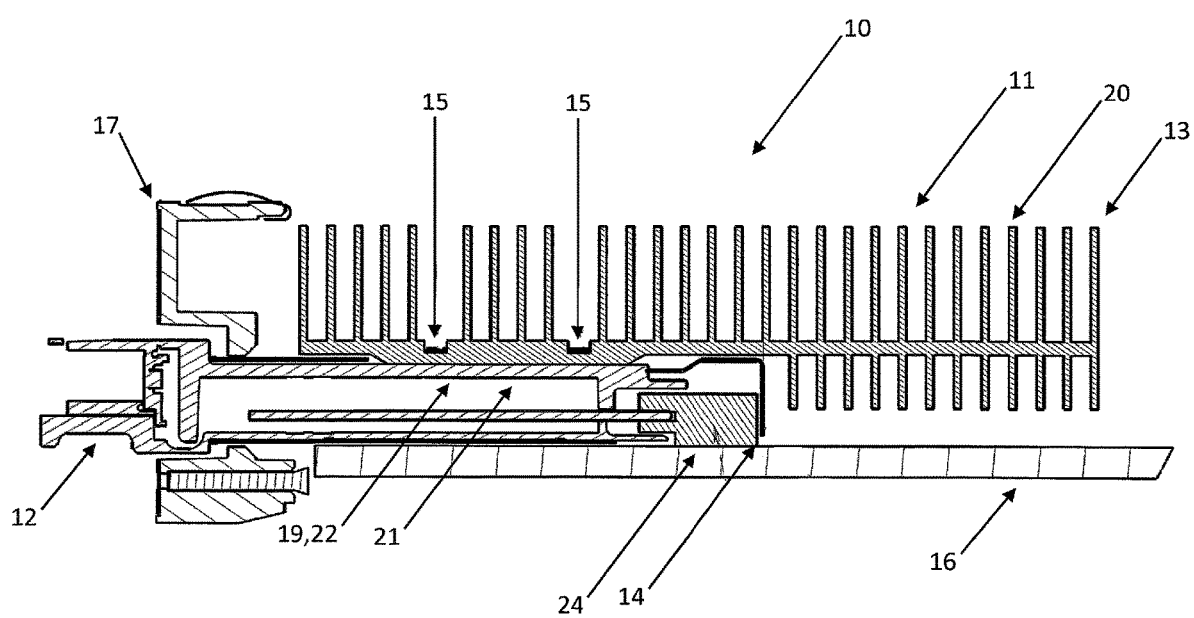
FIG. 4 is a cross-sectional side view of the circuit pack of FIG. 1, highlighting the associated cage and heatsink assembly with the pluggable optical device installed.

FIG. 3 is a cross-sectional side view of the circuit pack 10 of FIG. 1, highlighting the associated cage 14 and heatsink assembly 13 with the pluggable optical device 12 removed. FIG. 4 is a cross-sectional side view of the circuit pack 10 of FIG. 1, highlighting the associated cage 14 and heatsink assembly 13 with the pluggable optical device 12 installed. From these figures, collectively, it can be seen that a cantilever portion 11 of the heatsink 13 significantly overhangs the cage 14, to which the heatsink 13 is coupled via the spring clip 15. It is this cantilever portion 11 that causes a torque force on the spring clip 15, potentially deforming the spring clip 15. It should be noted here that the cage 14 is generally coupled to the PCBA 16 behind the faceplate 17 and an appropriate connector is disposed within the rear portion of the cage 14 for mating the pluggable optical device 12 with the circuit pack 10. As is well known to those of ordinary skill in the art, a typical heatsink 13 includes a heatsink surface 19 and a plurality of thermally coupled fin structures 20 or the like, collectively operable for collecting and dissipating heat to the surrounding environmental medium.

The heatsink surface 19 is brought into thermal contact with a hot surface of the pluggable optical device 12 through an opening 21 manufactured into the cage 14. The heatsink surface 19 in this region may be thickened or include one or more protruding portions 22 for extending through the opening 21 manufactured into the cage 14 and thermally contacting the hot surface of the pluggable optical device 12. It should be noted that other suitable thermally conductive structures may also be disposed between the heatsink surface 19 and the hot surface of the pluggable optical device 12, if so desired. Preferably, the edges of the thickened or protruding potions 22 of the heatsink surface 19 are tapered such that the thickened or protruding potions 22 of the heatsink surface 19 can smoothly engage with/disengage from the opening 21 manufactured into the cage 14 when the pluggable optical device is inserted into/withdrawn from the cage 14. In general, it is important that intimate thermal contact be achieved and maintained between the heatsink surface 19 and the hot surface of the pluggable optical device 12. This intimate thermal contact is achieved and maintained by a spring force exerted by the spring clip 15.

Figure 5:
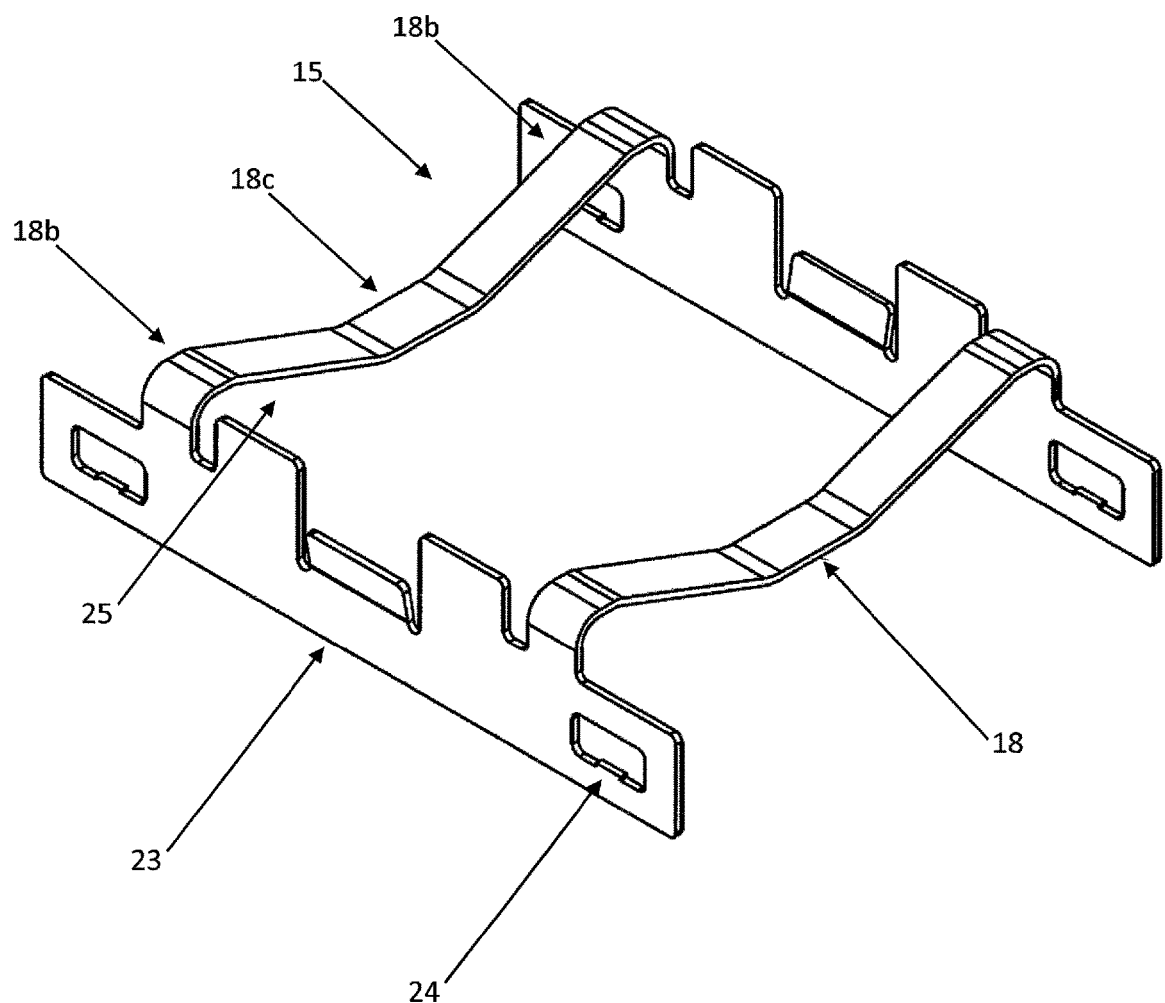
FIG. 5 is a perspective view of one exemplary embodiment of the spring clip utilized with the heatsink assembly provided herein.

Referring now specifically to FIG. 5, the spring clip 15 typically includes one or more leaf spring portions 18 coupled between a plurality of side portions 23. The side portions 23 are configured to securely engage the sides of the cage 14, and include a plurality of locking tabs 24 or the like for this purpose. The leaf spring portions 18 each include a cross member structure or the like that includes a central portion 18a that is configured to directly engage the heatsink surface 19 opposite the hot surface of the pluggable optical device 12 and a plurality of biasing portions 18b that are configured to apply the desired spring force to the heatsink surface 19 opposite the hot surface of the pluggable optical device 12. This ensures intimate thermal contact between the heatsink surface 19 and the hot surface of the pluggable optical device 12 when the heatsink 13 is disposed adjacent to the pluggable optical device 12 and secured by the spring clip 15 attached to the cage 14. Often, the spring clip 15 is manufactured from a resilient metallic material or the like for this purpose. When installed in such an arrangement, the biasing portions 18b of the leaf spring portions 18 are separated from the underlying heatsink surface 19 to apply the desired spring force. It is this lack of conformity and these gaps 25 that allow the spring clip 15 to be deformed and compromised under heatsink torque loading.

Figure 6:
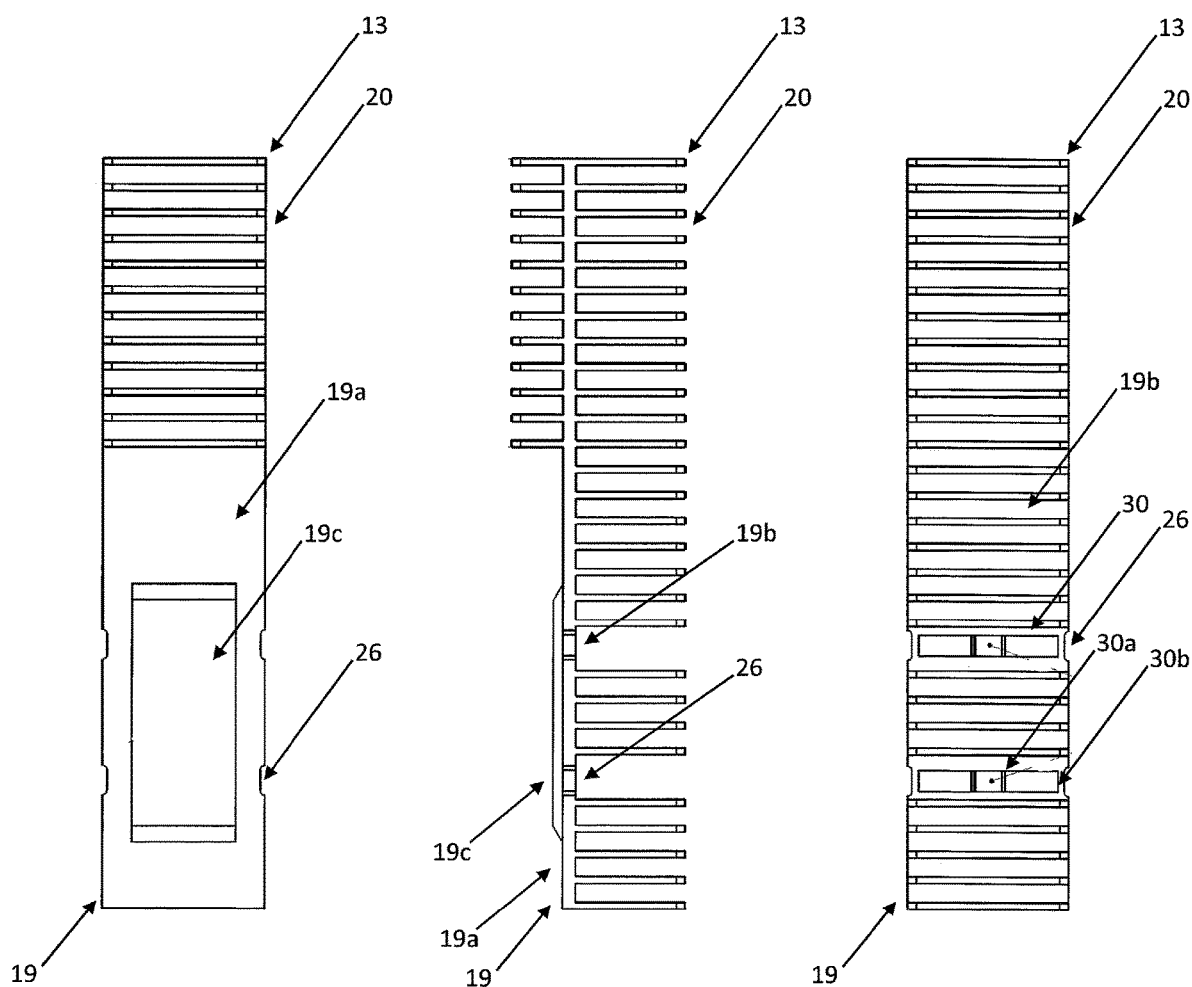
FIG. 6 is a perspective view of one exemplary embodiment of the heatsink assembly provided herein.

FIG. 6 illustrates one exemplary embodiment of the heatsink 13 provided herein. As alluded to above, the heatsink 13 may be manufactured from any suitable planar metallic or other material that is suitable for drawing heat from the adjacent pluggable optical device 12 and expelling it into the surrounding environmental medium through the coupled fin structures 20. The heatsink surface 19 includes a first surface 19a that thermally contacts the pluggable optical device 12 when it is inserted into the circuit pack 10. This first surface 19a is generally devoid of fin structures 20, except on a back portion thereof that is disposed behind the cage 14 within the circuit pack 10. A contact surface 19c protrudes from the first surface 19c through the opening provided in the cage 14. This contact surface 19c is preferably flat or otherwise contoured to maximize thermal contact with the adjacent pluggable optical device 12. The heatsink surface 19 also includes a second surface 19b disposed opposite the first surface 19a, the second surface 19b including a plurality of fin structures 20 along its length. One or more voids are provided between the fin structures 20 on the second surface 19b to receive the spring clip 15 that couples the heatsink 13 to the adjacent pluggable optical device 12, and specifically the leaf spring portion(s) 18 of the spring clip 15, including the central portion 18a and the biasing portions 18b. Notches 16 can also be provided in the sides of the heatsink surface 19 to receive these leaf spring portion(s) 18. Importantly, in these regions 30, the second surface 19b of the heatsink surface 19 is contoured or has a profile that substantially corresponds to the contour or profile of the associated leaf spring portion 18 of the spring clip 15, including a central portion 30a with a recessed contour or profile adapted to receive the central portion 18a of the leaf spring portion 18 and side portions 30b with a protruding contour or profile adapted to engage the biasing portions 18b of the leaf spring portion 18. Thus, these regions 30 of the second surface 19b of the heatsink surface 19 effectively receive the spring force of the spring clip 15, thereby biasing the heatsink 19 into the adjacent pluggable optical device 12, but also fill any gaps underneath the leaf spring portion 18 of the spring clip 15, especially under the biasing portions 18b of the leaf spring portion 18. The elimination of these intervening gaps prevents the spring clip 15 from being compromised when the heatsink 13 is handled improperly and acts as a cantilever against the spring clip 15. Each of the side portions 30b can be a ramp-shaped structure, or have any other suitable leaf spring portion conforming shape. Further, these regions 30 can be integrally formed with the second surface 19b of the heatsink surface 19, or they may be affixed thereto.

Figure 7:
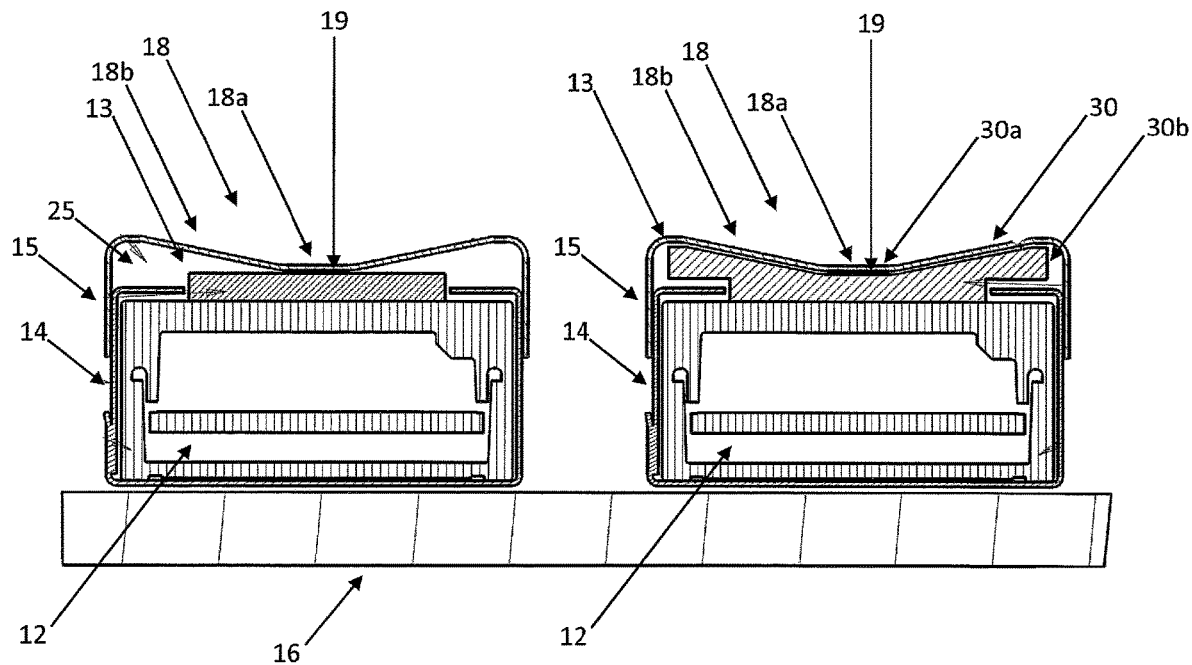
FIG. 7 is a cross-sectional end view of a conventional cage-heatsink assembly-spring clip interface and one exemplary embodiment of the cage-heatsink assembly-spring clip interface associated with the heatsink assembly provided herein.

FIG. 7 more clearly illustrates this interface between the heatsink surface 19 and the surrounding spring clip 15. As is shown, the cage 14 is disposed on top of the PCBA 16 and the pluggable optical device 12 is selectively disposed therein. The spring clip 15 is used to secure the heatsink 13 to the cage 14 and bias the heatsink 13 into the adjacent pluggable optical device 12 through the opening in the cage 14. On the left, with a conventional heatsink surface 19, the center portion 18a of the leaf spring portion 18 of the spring clip 15 contacts the heatsink surface 19, but the biasing portions 18b of the leaf spring portion 18 of the spring clip 15 are separated from the heatsink surface 19 by a gap 25, creating areas where the spring clip 15 can deform when a load or torque is applied to the heatsink 13. On the right, with the heatsink surface 19 provided herein, the center portion 18a of the leaf spring portion 18 of the spring clip 15 contacts the heatsink surface 19 or the center portion 30a of the heatsink profile 30 provided herein, and the biasing portions 18b of the leaf spring portion 18 of the spring clip 15 contact the side portions 30b of the heatsink profile 30 provided herein, closing the gaps 25, eliminating the areas where the spring clip 15 can deform when a load or torque is applied to the heatsink 13. Again, these regions 30 can be integrally formed with the second surface 19b of the heatsink surface 19, or they may be affixed thereto.

Thus, the present disclosure provides a heatsink for pluggable optical devices that incorporates features to limit the travel and deformation of the mating/mated spring clip that holds the heatsink to the cage of the pluggable optical device. The heatsink bearing surface takes the shape and contour of the leaf spring portion of the spring clip, thereby contacting and supporting it well before it plastically yields and permanently deforms. The shape of this feature, which may be coupled to or integrally formed with the heatsink bearing surface, can match exactly the shape of the spring clip or approximate the shape using a curved, variable, or other easier to manufacture profile, as long as the associated protrusions extend up into the corners of the leaf spring portion of the spring clip. This feature effectively acts as a hard stop and prevents the spring clip from being compromised due to improper handling or installation, a failure that is difficult to detect until circuit packs are installed at a customer site. This feature can be added to any pluggable optical device heatsink that uses a spring clip of this nature, regardless of the heatsink fin orientation or overall heatsink shape.

The present disclosure provides features on the heatsink that conform to the shape of the spring clip and contact the spring clip before the spring clip yields. Standard pluggable optical device heatsinks have flat surfaces on the spring clip bearing surface, which is simple to manufacture but affords no protection to the spring clip should the heatsink be handled incorrectly. This is because the travel of the spring clip leaf spring is not limited in the conventional configuration. Cage and spring clip components are often manufactured from inexpensive, low grade, compliant materials that exacerbate this deformation issue since the spring clip yields much sooner than higher grade materials would, making it easier to compromise the assembled circuit pack in the field. The present disclosure solves this problem.

Although the present disclosure is illustrated and described with reference to preferred embodiments and specific examples thereof, it will be readily apparent to those of ordinary skill in the art that other embodiments and examples can perform similar functions and/or achieve like results. All such equivalent embodiments and examples are within the spirit and scope of the present disclosure, and are intended to be covered by the following non-limiting claims for all purposes.

What is claimed is:

1. A heatsink assembly, comprising:
a heatsink surface comprising a first surface adapted to thermally contact an adjacent pluggable optical device and a second surface adapted to receive a biasing force from a spring clip having a leaf spring including a center portion that contacts the second surface and one or more biasing portions that are spaced apart from the second surface forming one or more gaps therebetween, wherein the biasing force biases the heatsink surface into the adjacent pluggable optical device; and
one or more protruding structures disposed on the second surface and adapted to fill all or a portion of the one or more gaps formed between the second surface and the one or more biasing portions of the leaf spring of the spring clip,
wherein a local contour of the second surface is adapted to conform to a contour of the center portion and the one or more protruding structures include one of a curved and variable shape, the one of the curved and variable shape conforming to a contour of the one or more biasing portions adjacent to the center portion, such that the second surface includes a matching shape with the center portion and the one or more biasing portions where the second surface contacts and supports the one or more biasing portions during deformation of the spring clip.

2. The heatsink assembly of claim 1, wherein the one or more protruding structures are coupled to the second surface.

3. The heatsink assembly of claim 1, wherein the one or more protruding structures are integrally formed with the second surface.

4. The heatsink assembly of claim 1, wherein the one or more protruding structures comprise one or more opposed ramp structures.

5. The heatsink assembly of claim 1, further comprising a plurality of fin structures coupled to the second surface and disposed adjacent to the one or more protruding structures.

6. The heatsink assembly of claim 1, further comprising a plurality of fin structures coupled to the first surface.

7. A circuit pack assembly, comprising:
a cage adapted to receive a pluggable optical device therein, wherein the cage defines an opening therethrough;
a heatsink assembly; and
a spring clip adapted to couple the heatsink assembly to the cage;
wherein the heatsink assembly comprises a heatsink surface comprising a first surface adapted to thermally contact the pluggable optical device through the opening defined through the cage and a second surface adapted to receive a biasing force from the spring clip comprising a leaf spring comprising a center portion that contacts the second surface and one or more biasing portions that are spaced apart from the second surface forming one or more gaps therebetween, wherein the biasing force biases the heatsink surface into the pluggable optical device through the opening defined through the cage; and
wherein the heatsink assembly comprises one or more protruding structures disposed on the second surface and adapted to fill all or a portion of the one or more gaps formed between the second surface and the one or more biasing portions of the leaf spring of the spring clip,
wherein a local contour of the second surface conforms to a contour of the center portion and the one or more protruding structures include one of a curved and variable shape, the one of the curved and variable shape conforming to a contour of the one or more biasing portions adjacent to the center portion, such that the second surface includes a matching shape with the center portion and the one or more biasing portions where the second surface contacts and supports the one or more biasing portions during deformation of the spring clip.

8. The circuit pack assembly of claim 7, wherein the one or more protruding structures are coupled to the second surface.

9. The circuit pack assembly of claim 7, wherein the one or more protruding structures are integrally formed with the second surface.

10. The circuit pack assembly of claim 7, wherein the one or more protruding structures comprise one or more opposed ramp structures.

11. The circuit pack assembly of claim 7, wherein the heatsink assembly further comprises a plurality of fin structures coupled to the second surface and disposed adjacent to the one or more protruding structures.

12. The circuit pack assembly of claim 7, wherein the heatsink assembly further comprises a plurality of fin structures coupled to the first surface.

13. A method for providing a heatsink assembly, comprising:
providing a heatsink surface comprising a first surface adapted to thermally contact an adjacent pluggable optical device and a second surface adapted to receive a biasing force from a spring clip having a leaf spring including a center portion that contacts the second surface and one or more biasing portions that are spaced apart from the second surface forming one or more gaps therebetween, wherein the biasing force biases the heatsink surface into the adjacent pluggable optical device; and disposing one or more protruding structures on the second surface and adapted to fill all or a portion of the one or more gaps formed between the second surface and the one or more biasing portions of the leaf spring of the spring clip, wherein a local contour of the second surface conforms to a contour of the center portion and the one or more protruding structures include one of a curved and variable shape, the one of the curved and variable shape conforming to a contour of the one or more biasing portions adjacent to the center portion, such that the second surface includes a matching shape with the center portion and the one or more biasing portions where the second surface contacts and supports the one or more biasing portions during deformation of the spring clip.

14. The method of claim 13, wherein the one or more protruding structures are coupled to the second surface.

15. The method of claim 13, wherein the one or more protruding structures are integrally formed with the second surface.

16. The method of claim 13, wherein the one or more protruding structures comprise one or more opposed ramp structures.

17. The method of claim 13, further comprising providing a plurality of fin structures coupled to one or more of the first surface and the second surface adjacent to the one or more protruding structures.

* * * * *